United States Patent
Lin et al.

(10) Patent No.: US 6,982,531 B2
(45) Date of Patent: Jan. 3, 2006

(54) DRIVING CIRCUIT FOR SWITCHES OF DIRECT CURRENT FAN MOTOR

(75) Inventors: Lain-ken Lin, Changhua (TW); Sans Chang, Taipei (TW); Magellan Chiu, Taichung (TW); Wen-shi Huang, Taoyuan (TW)

(73) Assignee: Delta Electronics, Inc., (TW)

( * ) Notice: Subject to any disclaimer, the term of this patent is extended or adjusted under 35 U.S.C. 154(b) by 322 days.

(21) Appl. No.: 10/651,587

(22) Filed: Aug. 29, 2003

(65) Prior Publication Data

US 2004/0264948 A1 Dec. 30, 2004

(30) Foreign Application Priority Data

Jun. 26, 2003 (TW) ................................ 92117425 A

(51) Int. Cl.
*H02P 3/18* (2006.01)

(52) U.S. Cl. ...................... 318/254; 318/138; 318/439; 318/599; 388/800; 388/804; 388/819; 388/907.2; 327/423; 327/587

(58) Field of Classification Search ................ 318/254, 318/138, 439, 599; 327/423, 494, 588; 388/800, 388/804, 811, 819, 829, 831, 907.2
See application file for complete search history.

(56) References Cited

U.S. PATENT DOCUMENTS

| | | | | |
|---|---|---|---|---|
| 4,325,112 A | * | 4/1982 | Otsuka | 363/42 |
| 5,589,805 A | * | 12/1996 | Zuraski et al. | 332/109 |
| 5,631,588 A | * | 5/1997 | Bertolini | 327/108 |
| 5,642,247 A | * | 6/1997 | Giordano | 361/31 |
| 5,859,519 A | * | 1/1999 | Archer | 318/801 |
| 5,990,640 A | * | 11/1999 | Dwyer et al. | 318/254 |
| 6,005,316 A | * | 12/1999 | Harris | 310/90.5 |
| 6,124,751 A | * | 9/2000 | Pidutti | 327/424 |
| 6,867,645 B1 | * | 3/2005 | Ansari et al. | 327/588 |

* cited by examiner

*Primary Examiner*—Rina Duda
(74) *Attorney, Agent, or Firm*—Martine Penilla & Gencarella, LLP

(57) ABSTRACT

A driving circuit for switches of direct current fan motor is disclosed. The driving circuit includes a plurality of switches, a first control circuit, and a second circuit. The switches are driven by a first pulse width modulation signal and a second pulse width modulation signal, and they are electrically connected with the direct current fan motor in a bridge manner. A third pulse width modulation signal is used to drive the first control circuit connected to at least one of the switches driven by the first pulse width modulation signal. A fourth pulse width modulation signal is used to drive the second control circuit connected to at least one of the switches driven by the second pulse width modulation signal. Especially, either the first pulse width modulation signal or the second pulse width modulation signal is selected as the third pulse width modulation signal or the fourth pulse width modulation signal.

22 Claims, 4 Drawing Sheets

DRIVING CIRCUIT FOR SWITCHES OF DIRECT CURRENT FAN MOTOR

BACKGROUND OF THE INVENTION (a) Field of the Invention

The invention relates to a control circuit of a direct current fan motor, and more particularly, to a driving circuit for switches of direct current fan motor.

(b) Description of the Related Art

Referring to FIG. 1, it is well known that two pulse width modulation (PWM) signals A and B are generally used within a circuit for driving four full-bridge switches 11, 12, 13 and 14 in order to control a rotational speed of the direct current fan motor 1. In practical applications, enhancement-mode metal-oxide semiconductor field-effect transistors (MOSFET) are usually selected as the switches 11, 12, 13 and 14.

With respect to the operations of the direct current motor fan 1, the PWM signals A and B drive the switches 11, 12, 13 and 14 with a high level, and stop driving the same with a low level. To be more precise, when the PWM signal A drives the switches 12 and 13 to be ON with a high level, the PWM signal B keeps the switches 11 and 14 to be OFF with a low level. As a result, the direct current fan motor 1 is conducted with a current having a direction as indicated by an arrow 15. Contrarily, when the PWM signal A is switched to a low level such that the switches 12 and 13 are OFF, the PWM signal B keeps the switches 11 and 14 to be ON with a high level. As a result, the direct current fan motor 1 is conducted with a current having a direction as indicated by an arrow 16. In other words, when the switches 12 and 13 are in an ON state, the switches 11 and 14 are in an OFF state; when the switches 11 and 14 are in an ON state, the switches 12 and 13 are in an OFF state.

However, there are problems during the switch of the ON/OFF state to the OFF/ON state for the above-mentioned switches because the direct current fan motor 1 is considered as an inductive load and these switches are mainly transistors. In other word, at the time when the switches 11 and 14, or the switches 12 and 13, are shifted from an ON state to an OFF state, counter-electromotive force produced within the direct current motor fan 1 is likely to shift the switches 11, 12, 13 and 14 at an OFF state back to an ON state, and thus results in malfunction of being ON instead of being OFF. The malfunction not only causes short circuit between the switches and then burn down switches, but also seriously damages the direct current fan motor 1.

SUMMARY OF THE INVENTION

As described above, a prior direct current fan motor have the switches thereof be prone to malfunction caused by counter-electromotive force from shifting current directions of the motor. The malfunction may simultaneously damage the switches, and further lead to damages of the motor as well.

To overcome the issue, the invention provides a driving circuit for switches of direct current fan motor. The driving circuit is additionally provided with corresponding control circuits for controlling ON-OFF operations of individual switches to ensure the switches free from malfunction of being ON instead of OFF.

An object of the invention is to provide a driving circuit for switches of direct current fan motor, which uses driving signals for the same switches to drive a control circuit and forcibly lock the switches to be in an OFF state when the switches are shifted from an ON state to an OFF state, thereby avoiding malfunction.

The other object of the invention is to provide a driving circuit for switches of direct current fan motor, which uses driving signals for the opposite switches to drive a control circuit and forcibly lock the self switches to be in an OFF state when the self switches are shifted from an ON state to an OFF state, thereby avoiding malfunction.

The driving circuit for switches of a fan motor according to the invention has a plurality of switches, a first control circuit and a second control circuit. The switches are driven by a first pulse width modulation (PWM) signal and a second PWM signal, and are connected with the direct current fan motor in a bridge manner. In addition, the first control circuit is electrically connected with at least one switch driven by the first PWM signal, and is driven by a third PWM signal. The second control circuit is electrically connected with at least one switch driven by the second PWM signal, and is driven by a fourth PWM signal.

One characteristic of the invention is that, when the first PWM signal is at a low level, the switch driven by the first PWM signal is in an OFF state, and the third PWM signal drives the first control circuit and locks the switch driven by the first PWM signal to an OFF state, while when the second PWM is at a low level, the switch driven by the second PWM is in an OFF state, and the fourth PWM signal drives the second control circuit and locks the switch driven by the second PWM signal to an OFF state.

Another characteristic of the invention is that, either the first PWM signal or the second PWM signal is selected as the third PWM signal or the fourth PWM signal.

The invention is advantaged in that malfunction of the switches resulted from intrinsic counter-electromotive force is avoided, short circuit current between the switches is prevented, and damages to the fan motor by malfunction of the switches are avoided as well.

DETAILED DESCRIPTION OF THE PREFERRED EMBODIMENTS

Figure 1:
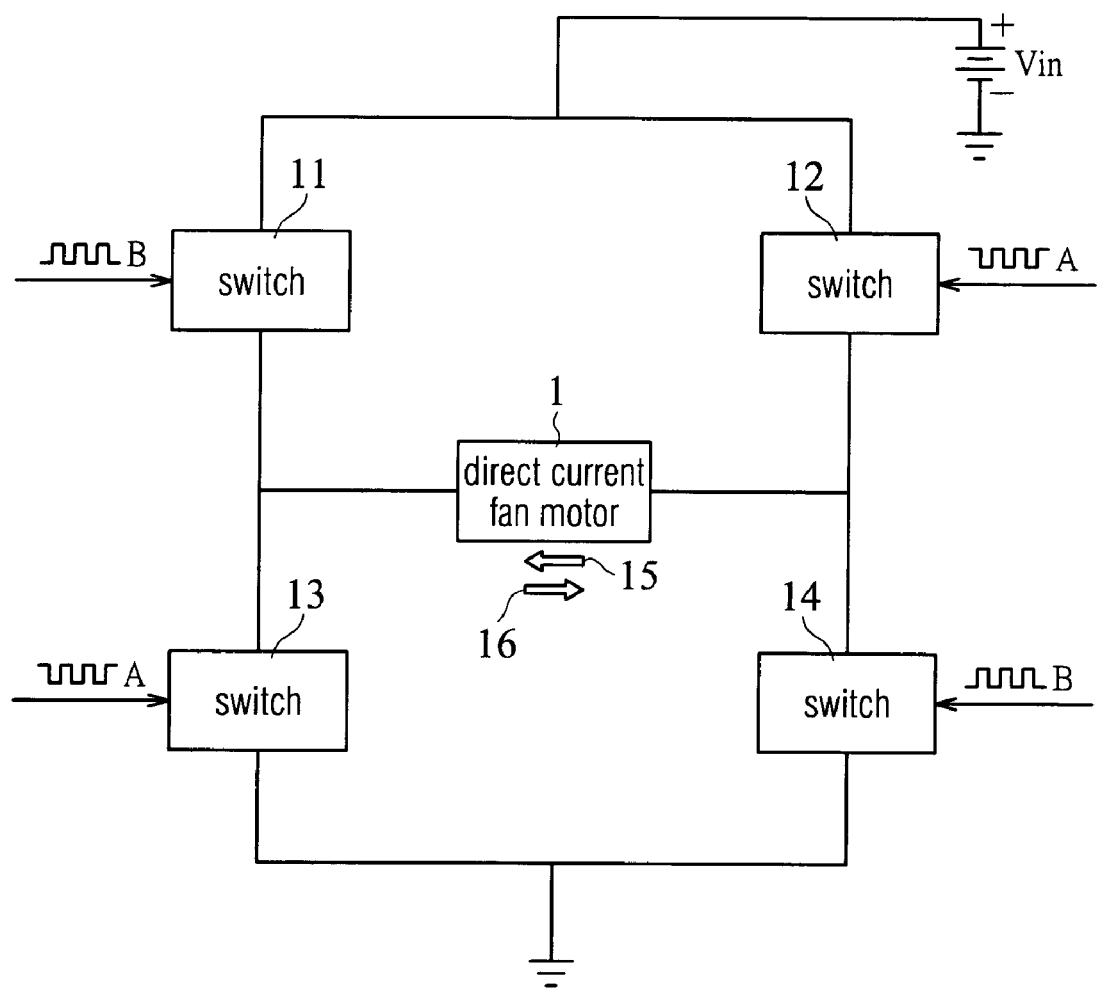
FIG. 1 shows a schematic view illustrating a structure of a prior driving circuit for switches of direct current fan motor.
Figure 2:
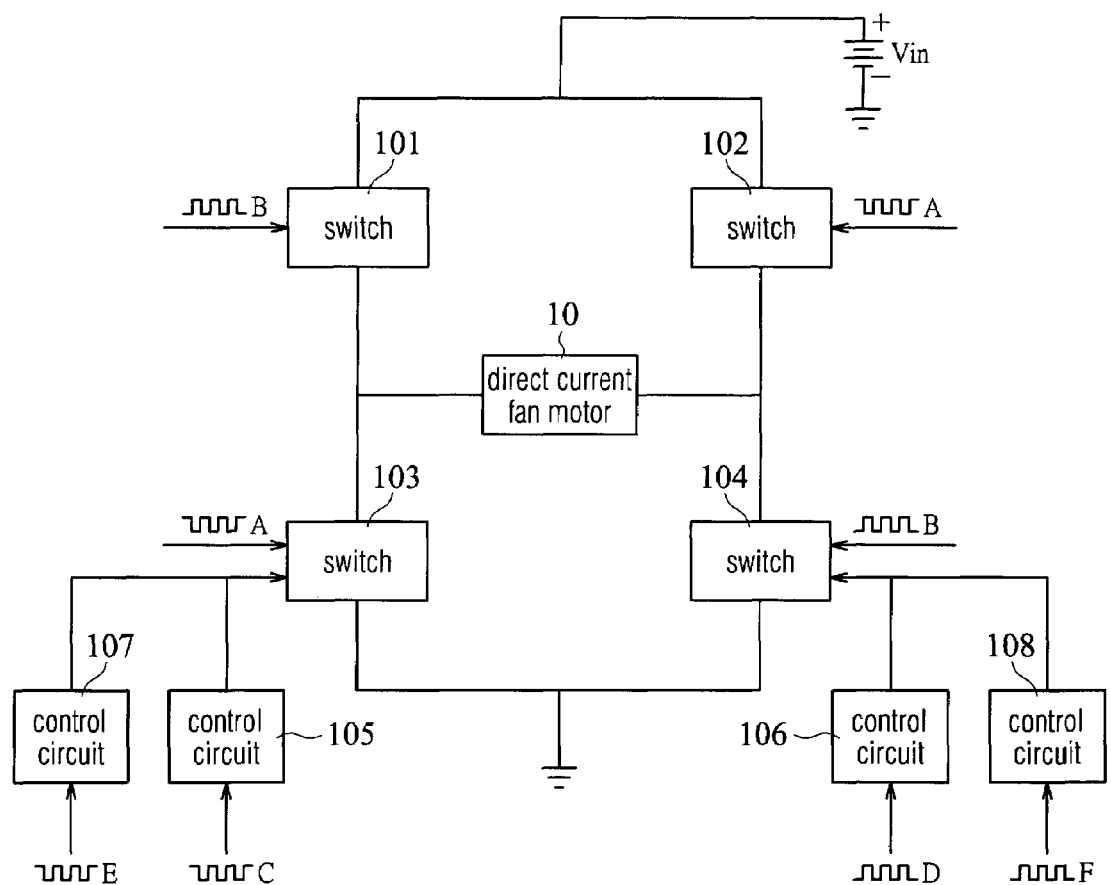
FIG. 2 shows a schematic view illustrating a structure of a driving circuit for switches of direct current fan motor according to the invention.

Referring to FIG. 2, a driving circuit for switches of direct current fan motor 10 according to the invention includes full-bridge connection switches 101, 102, 103 and 104, and control circuits 105 and 106 that are electrically connected to the switches 103 and 104, respectively. With respect to the operation of the invention, a pulse width modulation (PWM) signal A is used for driving the switches 102 and 103, and a PWM signal B is used for driving the switches 101 and 104, so as to conduct the direct current motor fan 10. When the PWM signal A shifts from a high level to a low level, the PWM signal B shifts from a low level to a high level. At the instant that the PWM signal A shifts from a high level to a low level, the switches 102 and 103 change from an ON state to an OFF state. Meanwhile, a PWM signal C with an appropriate level (high or low) is used for driving the control circuit 105, so that the control circuit 105 forcibly lock the switch 103 in an OFF state. Similarly, at the instant that the PWM signal B shifts from a high level to a low level, the switches 101 and 104 change from an ON state to an OFF state. In addition, a PWM signal D with an appropriate level (high or low) is also used for driving the control circuit 106, so that the control circuit 106 forcibly lock the switch 104 in an OFF state. Especially, the PWM signal C is selected from either the PWM signal A or the PWM signal B while the PWM signal D is selected from either the PWM signal B or the PWM signal A.

According to the invention, the circuit structure of the direct current motor fan 10 for switches can be disposed with other control circuits based upon variations in duty cycles of the PWM signals A, B, C and D. For instance, when the PWM signal C is at a low level and is incapable of driving the control circuit 105, a PWM signal E is used for driving a control circuit 107 and forcibly lock the switch 103 in an OFF state. Likewise, when the PWM signal D is at a low level and is incapable of driving the control circuit 106, a PWM signal F is used for driving a control circuit 108 and forcibly lock the switch 104 in an OFF state. Especially, the PWM signals A and B are processed via a logic gate (not shown) to output the PWM signals E and F.

Therefore, it is ensured that malfunction as being ON instead of OFF of the switches 101 and 104, or switches 102 and 103, are not incurred by instantaneous counter-electromotive force generated by the direct current fan motor 10.

Figure 3:
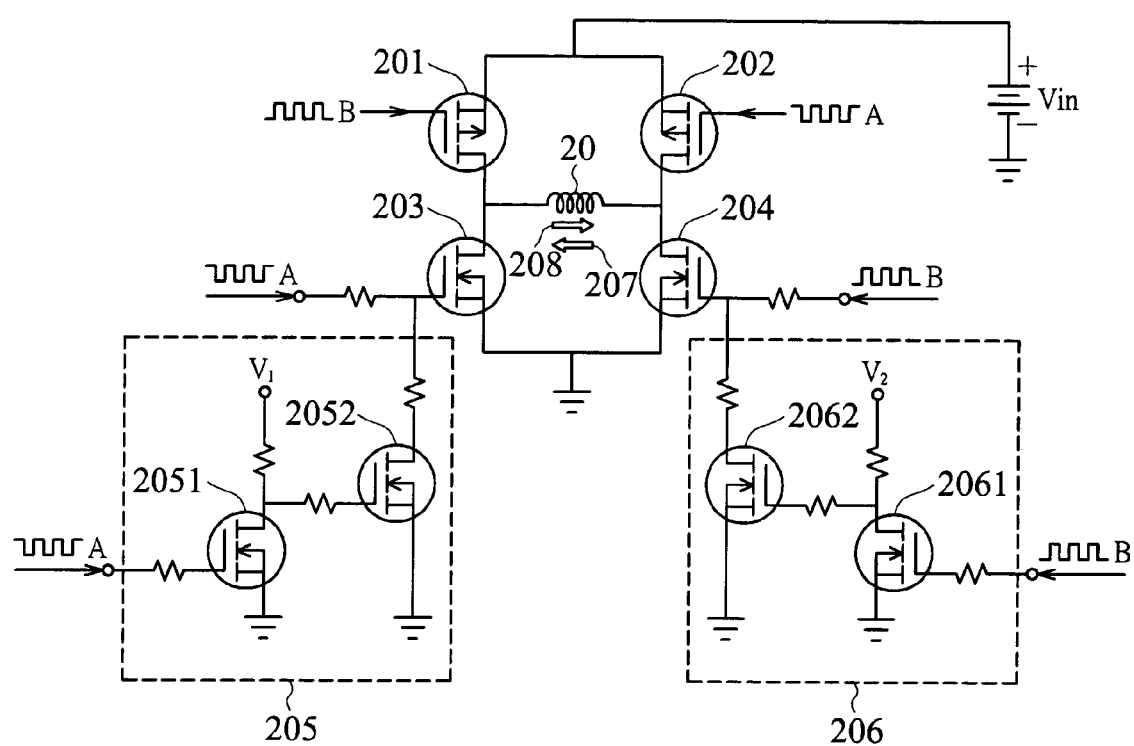
FIG. 3 shows a schematic view illustrating a driving circuit for switches of direct current fan motor according to a first embodiment of the invention.

Hereafter, detailed descriptions of preferred embodiments according to the invention shall be given with the accompanying drawings. Referring to FIG. 3 showing a driving circuit for switches of direct current fan motor according to a first embodiment the invention, a coil 20 represents a direct current fan motor having an input voltage of $V_{in}$. A PWM signal A is used to drive switches 202 and 203 while a PWM signal B is used to drive switches 201 and 204. The switches 201 and 202 are p-channel enhancement-mode metal-oxide semiconductor field-effect transistors (MOSFET), and the switches 203 and 204 are n-channel enhancement-mode MOSFET. The characteristics of the embodiment are that, the PWM signal A, an applied voltage $V_1$ and a control circuit 205 are further used to control the switch 203, and the PWM signal B, an applied voltage $V_2$ and a control circuit 206 are further used to control the switch 204, to make the potential difference between gates and sources of the switches 203 and 204 in an OFF state be virtually zero. As a result, the switches 203 and 204 are forcibly locked in an OFF state for preventing malfunction of the switches 203 and 204. In this embodiment, the control circuit 205 and control circuit 206 are identical, and have two n-channel enhancement-mode MOSFET switches 2051 and 2052, and 2061 and 2062, respectively.

The principles of driving the switches of fan motor are described as follows.

At first, the switches 202, 203 and 2051 are actuated by the PWM signal A with a high level to be in an ON state while the switch 2052 is kept in an OFF state, and the direct current fan motor is thus conducted with a current direction indicated as an arrow 207.

Subsequently, the switches 202, 203 and 2051 are shut down by the PWM signal A with a low level to be in an OFF state while the switch 2052 is driven by the applied voltage $V_1$ to be in an ON state and forms a loop with the switch 203 to force a short circuit between a gate G and a drain D of the switch 203. As for the switch 204, since the PWM signal B is still at a low level, the switch 2061 is in an OFF state while the switch 2062 is driven by the applied voltage $V_2$ to be in an ON state and forms a loop with the switch 204 to force a short circuit between a gate G and a source S of the switch 204. Consequently, at an instant that the switches 202 and 203 are shut down, the counter-electromotive force produced within the direct current fan motor does not lead to malfunction of being ON for the switches 203 and 204. Therefore, it is ensured that the switches 203 and 204 are normal in operation.

Similarly, the switches 201, 204 and 2061 are actuated by the PWM signal B with a high level to be in an ON state while the switch 2062 is kept in an OFF state, and the direct current fan motor is thus conducted with a current direction indicated as an arrow 208.

When the switches 201, 204 and 2061 are shut down by the PWM signal B with a low level to be in an OFF state while the switch 2062 is driven by the applied voltage $V_2$ to be in an ON state and forms a loop with the switch 204 to force a short circuit between a gate G and a drain D of the switch 204. As for the switch 203, since the PWM signal A is still at a low level, the switch 2051 is in an OFF state while the switch 2052 is driven by the applied voltage $V_1$ to be in an ON state and forms a loop with the switch 203 to force a short circuit between a gate G and a source S of the switch 203. Consequently, at an instant that the switches 201 and 204 are shut down, the counter-electromotive force produced within the direct current fan motor does not lead to malfunction of being ON for the switches 204 and 203.

It is to be noted that, the switches 203 and 204 in the embodiments adopt intrinsic driving signals, i.e., the PWM signals A and B, to drive the control circuits 205 and 206 to further lock the OFF state of itself. In other words, the driving circuit for switches in this embodiment is a self-locking circuit.

Figure 4:
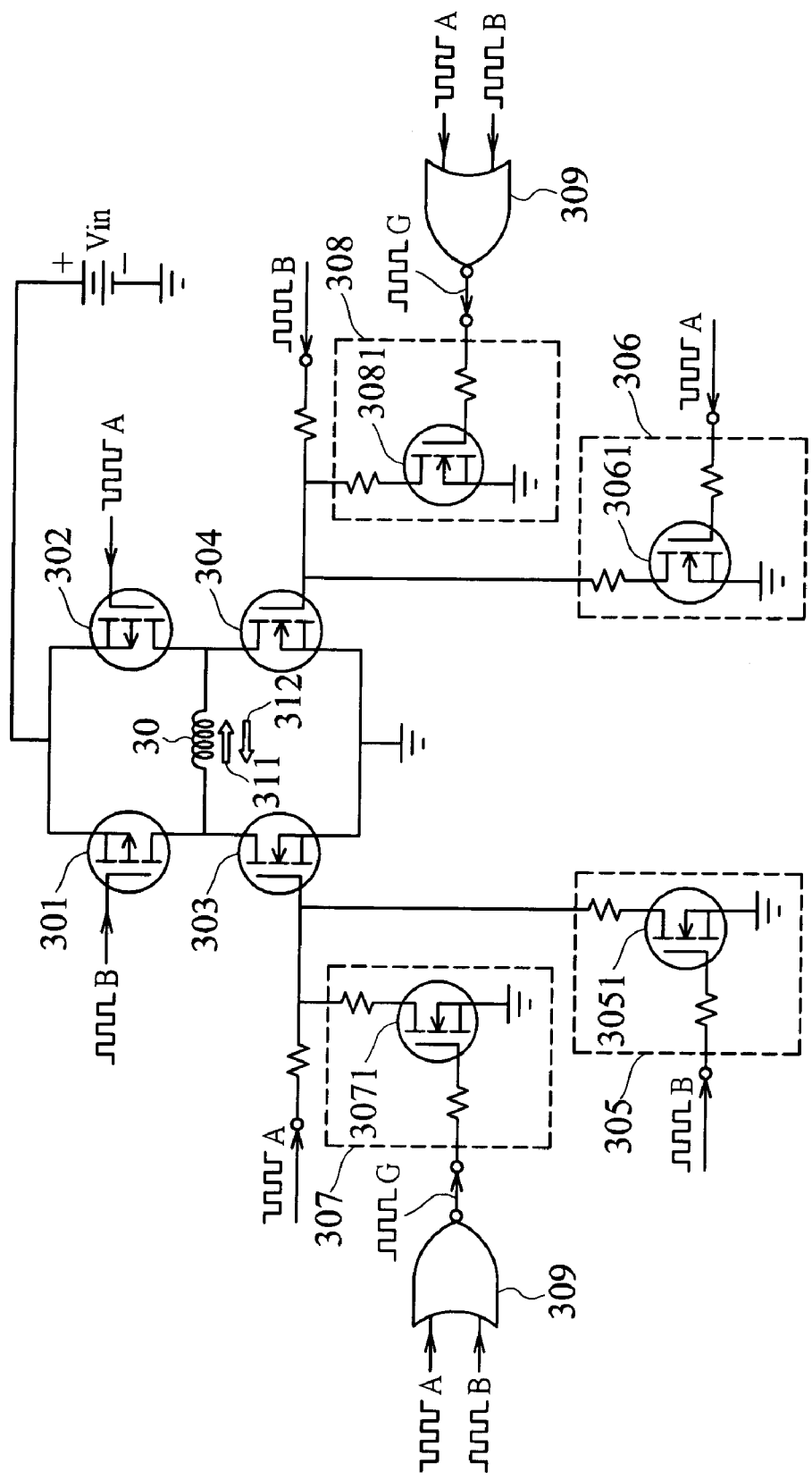
FIG. 4 shows a schematic view illustrating a driving circuit for switches of direct current fan motor according to a second embodiment of the invention.

Referring to FIG. 4 showing a driving circuit for switches of direct current fan motor according to a second embodiment of the invention, a coil 30 represents a direct current fan motor having an input voltage $V_{in}$. A PWM signal A is used to drive switches 302 and 303 while a PWM signal B is used to drive switches 301 and 304. The switches 301 and 302 are p-channel enhancement-mode metal-oxide semiconductor field-effect transistors (MOSFET), and the switches 303 and 304 are n-channel enhancement-mode MOSFET. The characteristics of the embodiment are that, the PWM signal B, a control circuit 305, 307, and a PWM signal G are further used to control the switch 303, and the PWM signal A, a control circuit 306, 308, and the PWM signal G are further used to control the switch 304, to make the potential difference between gates and sources of the switches 303 and 304 in an OFF state be virtually zero. As a result, the switches 303 and 304 are forcibly locked in an OFF state for preventing malfunction of the switches 303 and 304. In this embodiment, the control circuit 305 and control circuit 306 are identical and have two n-channel enhancement-mode MOSFET switches 3051 and 3061, respectively, and the control circuit 307 and control circuit 308 are identical and have two n-channel enhancement-mode MOSFET switches 3071 and 3081, respectively. In addition, the PWM signal G is determined by using a NOR-logic gate 309 to process the levels of the PWM signals A and B. For instance, when the PWM signals A and B are both low-level signals, the PWM signal G is a high-level signal.

The principles of driving the switches of direct current fan motor in this embodiment shall be described.

When the switches 302 and 303 are actuated by the PWM signal A with a high level to be in an ON state, the direct current fan motor is thus conducted with a current direction indicated as an arrow 311.

In a short period that the PWM signal A shifts from a high level to a low level to make the switches 302 and 303 be in an OFF state, the switch 3051 is in an OFF state for that the PWM signal B is still at a low level. At this point, the PWM signal G is mainly used to force short circuits between the gates and sources of the switches 303 and 304. In other words, when the PWM signals A and B are both at a low level, the NOR logic gate 309 outputs a high-level signal to make the switches 3071 and 3081 be in an ON state and form loops with the switches 303 and 304, thereby forcibly locking the switches 303 and 304 in an OFF state.

Similarly, When the switches 301 and 304 are actuated by the PWM signal B with a high level to be in an ON state, the direct current fan motor is thus conducted with a current direction indicated as an arrow 312. In a short period that the PWM signal B shifts from a high level to a low level to make the switches 301 and 304 be in an OFF state, the switch 3061 is in an OFF state for that the PWM signal A is still at a low level. At this point, the PWM signal G is mainly used to force short circuits between the gates and sources of the switches 303 and 304.

Consequently, at the instant that the switches 302 and 303 are shut down, or at the instant that the switches 301 and 304 are shut down, the counter-electromotive force produced within the direct current fan motor does not produce interference against the switches 303 or 304, nor does it lead to malfunction of being ON for the switches 303 and 304.

In this embodiment, the switches 303 adopts the PWM signal B of the switch 304 to drive the control circuits 305 and to further lock an OFF state of itself, and the switch 304 adopts the PWM signal A of the switch 303 to drive the control circuit 306 and to further lock an OFF state of itself. Therefore, the driving circuits for switches in this embodiment are mutual-locking circuits.

The embodiments and examples according to the invention are fully illustrated as in the above descriptions. For those who are skilled in this art, it is understood that the embodiments according to the invention are illustrative but not limitative. For instance, the direct current fan motor 10 may also be in semi-bridge connection with the switches 103 and 104. Without departing from the true spirit and scope of the invention, various modifications and changes of the direct current fan motor shall be included by the appended claims of the invention.

What is claimed is:

1. A driving circuit for switches of direct current fan motor comprising:
    a plurality of switches driven by a first pulse width modulation (PWM) signal and a second PWM signal;
    a first control circuit electrically connected with at least one switch driven by the first PWM signal, and driven by a third PWM signal; and
    a second control circuit electrically connected with at least one switch driven by the second PWM signal, and driven by a fourth PWM signal;
    wherein, when the first PWM signal is at a low level, the switches driven by the first PWM signal are in an OFF state, and the third PWM signal drives the first control circuit and locks the switches driven by the first PWM signal to an OFF state; and when the second PWM is at a low level, the switches driven by the second PWM are in an OFF state, and the fourth PWM signal drives the second control circuit and locks the switches driven by the second PWM signal to an OFF state.

2. The driving circuit for switches of direct current fan motor as described in claim 1, wherein the third PWM signal is the first PWM signal, and the fourth PWM signal is the second PWM signal.

3. The driving circuit for switches of direct current fan motor as described in claim 1, wherein the third PWM signal is the second PWM signal, and the fourth PWM signal is the first PWM signal.

4. The driving circuit for switches of direct current fan motor as described in claim 1, wherein the switches have n-channel enhancement-mode metal-oxide semiconductor field-effect transistors (MOSFET) and p-channel enhancement-mode MOSFET.

5. The driving circuit for switches of direct current fan motor as described in claim 1, wherein the first control circuit and the second control circuit have an n-channel enhancement-mode MOSFET, respectively.

6. The driving circuit for switches of direct current fan motor as described in claim 1, further comprising:
    a third control circuit electrically connected with switches driven by the first PWM signal, and driven by a fifth PWM signal; and
    a fourth control circuit electrically connected with switches driven by the second PWM signal, and driven by a sixth PWM signal;
    wherein, when the first PWM signal and the second PWM signal are simultaneously at a low level, the fifth PWM signal drives the third control circuit and locks the switch driven by the first PWM signal to an OFF state, and the sixth PWM signal drives the fourth control circuit and locks the switch driven by the second PWM signal to an OFF state.

7. The driving circuit for switches of direct current fan motor as described in claim 6, wherein the fifth PWM signal is identical to the sixth PWM signal, and is an output signal of a NOR logic gate receiving and processing the first PWM signal and the second PWM signal.

8. The driving circuit for switches of direct current fan motor as described in claim 6, wherein the third control circuit and the fourth control circuit have an n-channel enhancement-mode MOSFET, respectively.

9. A driving circuit for switches of direct current fan motor comprising:
    two first switches connected with the direct current fan motor in a bridge manner, and driven by a first PWM signal and a second PWM signal, respectively;
    a first control circuit electrically connected with the first switch driven by the first PWM signal, and driven by the first PWM signal and a first applied voltage; and
    a second control circuit electrically connected with the first switch driven by the second PWM signal, and driven by the second PWM signal and a second applied voltage;
    wherein, when the first PWM signal is at a low level, the first switch driven by the first PWM signal is in an OFF state; and when the second PWM signal is at a low level, the first switch driven by the second PWM signal is in an OFF state.

10. The driving circuit for switches of direct current fan motor as described in claim 9, wherein the first and second control circuits have a second switch, respectively; when the first PWM signal and the second PWM signal are simultaneously at a low level, the second switch of the first control circuit is in an ON state and forms a loop with the first switch driven by the first PWM signal, and the second switch of the second control circuit is in an ON state and forms a loop with the first switch driven by the second PWM signal.

11. The driving circuit for switches of direct current fan motor as described in claim 9, wherein the first switches are n-channel enhancement-mode MOSFET.

12. The driving circuit for switches of direct current fan motor as described in claim 10, wherein the second switches are n-channel enhancement-mode MOSFET, and when the first PWM signal and the second PWM signal are simultaneously at a low level, potential difference between a gate and a source of the first switches are zero.

13. The driving circuit for switches of direct current fan motor as described in claim 9, further comprising two second switches connected with the direct current fan motor and the first switches in a bridge manner, and driven by the first PWM signal and the second PWM signal, respectively.

14. The driving circuit for switches of direct current fan motor as described in claim 13, wherein the second switches are p-channel enhancement-mode MOSFET.

15. A driving circuit for switches of direct current fan motor comprising:
   two first switches electrically connected with the direct current fan motor in a bridge manner, and driven by a first PWM signal and a second PWM signal, respectively;
   a first control circuit electrically connected with the first switch driven by the first PWM signal, and driven by the second PWM signal;
   a second control circuit electrically connected with the first switch driven by the second PWM signal, and driven by the first PWM signal;
   a NOR logic gate for receiving the first PWM signal and the second PWM signal, and outputting a third PWM signal;
   a third control circuit electrically connected with the first switch driven by the first PWM signal, and driven by the third PWM signal; and
   a fourth control circuit electrically with the first switch driven by the second PWM signal, and driven by the third PWM signal;
   wherein, when the first PWM signal is at a low level, the first switch driven by the first PWM signal is in an OFF state; and when the second PWM signal is at a low level, the first switch driven by the second PWM signal is in an OFF state.

16. The driving circuit for switches of direct current fan motor as described in claim 15, wherein the third control circuit and the fourth control circuit have a second switch, respectively, and when the first PWM signal and the second PWM signal are simultaneously at a low level, the second switches are in an ON state and forms a loop with the first switches.

17. The driving circuit for switches of direct current fan motor as described in claim 15, wherein the first control circuit and the second control circuit have a third switch, respectively, and when the first PWM signal is at a low level and the second PWM signal is at a high level, the third switch of the first control circuit is in an ON state and forms a loop with the first switch driven by the first control circuit; and when the second PWM signal is at a low level and the first PWM signal is at a high level, the third switch of the second control circuit is in an ON state and forms a loop with the first switch driven by the second PWM signal.

18. The driving circuit for switches of direct current fan motor as described in claim 15, wherein the first switches are n-channel enhancement-mode MOSFET.

19. The driving circuit for switches of direct current fan motor as described in claim 16, wherein the second switches are n-channel enhancement-mode MOSFET, and when the first PWM signal and the second PWM signal are simultaneously at a low level, potential difference between gates and sources of the first switches are zero.

20. The driving circuit for switches of direct current fan motor as described in claim 19, wherein the third switches are n-channel enhancement-mode MOSFET, and when the first PWM signal is at a low level and the second PWM signal is at a high level, potential difference between the gate and source of the first switches driven by the first PWM signal are zero; and when the second PWM signal is at a low level and the first PWM signal is at a high level, potential difference between the gate and source of the first switches driven by the second PWM signal are zero.

21. The driving circuit for switches of direct current fan motor as described in claim 15, further comprising two second switches electrically connected with the direct current fan motor and the first switches in a bridge manner, and driven by the first PWM signal and the second PWM signal, respectively.

22. The driving circuit for switches of direct current fan motor as described in claim 21, wherein the second switches are p-channel enhancement-mode MOSFET.

* * * * *